(12) United States Patent
Guebels

(10) Patent No.: US 7,164,324 B2
(45) Date of Patent: Jan. 16, 2007

(54) CMOS SINGLE-ENDED FREQUENCY DOUBLER

(75) Inventor: Pierre Paul Guebels, Pleasanton, CA (US)

(73) Assignee: Phaselink Semiconductor Corporation, Labuan FT (MY)

( * ) Notice: Subject to any disclaimer, the term of this patent is extended or adjusted under 35 U.S.C. 154(b) by 43 days.

(21) Appl. No.: 10/973,277

(22) Filed: Oct. 27, 2004

(65) Prior Publication Data

US 2006/0097810 A1 May 11, 2006

(51) Int. Cl.
H03B 5/12 (2006.01)
H03B 5/34 (2006.01)
H03B 9/14 (2006.01)

(52) U.S. Cl. .............. 331/117 FE; 331/53; 331/56
(58) Field of Classification Search ............... 331/37, 331/38, 53, 56, 117 FE
See application file for complete search history.

(56) References Cited

U.S. PATENT DOCUMENTS

| | | | |
|---|---|---|---|
| 6,181,216 B1 * | 1/2001 | Waight ............... 331/117 FE |
| 6,249,190 B1 * | 6/2001 | Rozenblit et al. ............ 331/46 |
| 6,326,854 B1 * | 12/2001 | Nicholls et al. .............. 331/56 |
| 6,621,363 B1 * | 9/2003 | Park et al. ............ 331/117 FE |
| 6,707,344 B1 * | 3/2004 | Cargill et al. ................. 331/74 |
| 2004/0113707 A1 * | 6/2004 | Fredriksson ................ 331/135 |

* cited by examiner

*Primary Examiner*—Robert Pascal
*Assistant Examiner*—James Goodley
(74) *Attorney, Agent, or Firm*—Rosenberg, Klein & Lee

(57) ABSTRACT

A CMOS single-ended frequency doubler with improved subharmonic rejection and low phase noise which allows a single ended reference signal to be utilized in a Balanced Colpitts oscillator. The input is reproduced with a 180-degree phase shift for the opposite Colpitts transistor. This is achieved by adding two PMOS transistors. One transistor is placed as a follower, which reproduces any voltage shift applied to its gate to its source. Another transistor is a matching transistor for balance. By applying the single-ended signal to the gate of the follower transistor, it is reproduced at the source. The rest of the circuit takes advantage of the summing of two period currents with a 180-degree phase shift. The present invention achieves superior performance for frequency doubling due to the squaring of the gate voltage in the corresponding drain current. As a result, the double frequency component is further enhanced.

12 Claims, 1 Drawing Sheet

CMOS SINGLE-ENDED FREQUENCY DOUBLER

BACKGROUND OF THE INVENTION

1. Field of the Invention

The present invention relates to an oscillator circuit. More specifically, the present invention discloses an efficient CMOS oscillator, which effectively doubles the frequency of a single-ended input signal.

2. Description of the Prior Art

The need for higher frequency reference signals has exacerbated the importance of frequency multiplication circuits that preserve phase noise at an affordable cost.

While Phase Locked Loops (PLL) are widely used, a PLL's phase noise performance is mainly limited to that of its voltage control oscillator (VCO). For phase noise and jitter sensitive applications, non-PLL frequency multiplication is required, in particular frequency doublers.

One type of frequency doubler uses a mixer to derive the higher frequency and filter out the subharmonics and undesired harmonics. However, these solutions only achieve limited harmonic and subharmonic rejection.

Other disadvantages to conventional approaches are designs that only exist in Bipolar (BJT and HBT) transistors and are not available in CMOS technology.

Furthermore, conventional low-cost techniques are unavailable for efficiently utilizing a single-ended input signal as a reference frequency source.

Therefore, there is need for a CMOS oscillator circuit, which effectively doubles the frequency of a single-ended input signal and exhibits improved subharmonic rejection and low phase noise.

SUMMARY OF THE INVENTION

To achieve these and other advantages and in order to overcome the disadvantages of the conventional method in accordance with the purpose of the invention as embodied and broadly described herein, the present invention provides a CMOS single-ended frequency doubler with improved subharmonic rejection and low phase noise.

The single-ended frequency doubler or squarer of the present invention modifies the basic structure of the Balanced Colpitts oscillator in order to allow a single ended reference signal to be used by the Balanced Colpitts oscillator, while still achieving low phase noise and good subharmonic rejection.

The present invention also offers a simple structure as an alternative to a large and expensive transformer or balun (balanced-unbalanced) based single-ended to differential converter that would otherwise be required for translating a single ended reference to an acceptable balanced differential input to the Balanced Colpitts.

For better subharmonic rejection, the present invention exploits the MOSFET characteristic of a drain current proportional to the square of the gate voltage as expressed in the equation $$I_D = \frac{1}{2}\mu Cox \frac{W}{L} * (v_{gs} - v_T)^2$$

In a circuit where only one single-ended input is available, the input is applied to the gate of a Colpitts transistor. In order to utilize the benefits of the balanced Colpitts, it is desirable to reproduce the input with a 180-degree phase shift for the gate of the opposite Colpitts transistor.

The present invention takes advantage of the possibility not only to drive a transistor from its gate, but also from its source with a 180-degree phase shift. This objective could be achieved by applying the original single-ended signal to the opposite Colpitts transistor without disrupting the symmetry of the balance of the circuit. Applying two 180 degree phase shifts in sequence is equivalent to a 0 degree phase shift or the original signal.

This is achieved by adding two PMOS transistors. One transistor is placed as a follower, which reproduces any voltage shift applied to its gate to its source. Another transistor is a matching and symmetrical transistor for balance.

Therefore, by applying the single-ended signal to the gate of the follower transistor, it is reproduced at the source, thus achieving the desired effect. The rest of the circuit takes advantage of the summing of two period currents with a 180-degree phase shift.

Additionally, the present invention achieves superior performance for frequency doubling due to the squaring of the gate voltage in the corresponding drain current as illustrated in the equation above. The square of the periodic signal contains a DC component and a double frequency component. As a result, the double frequency component is further enhanced.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
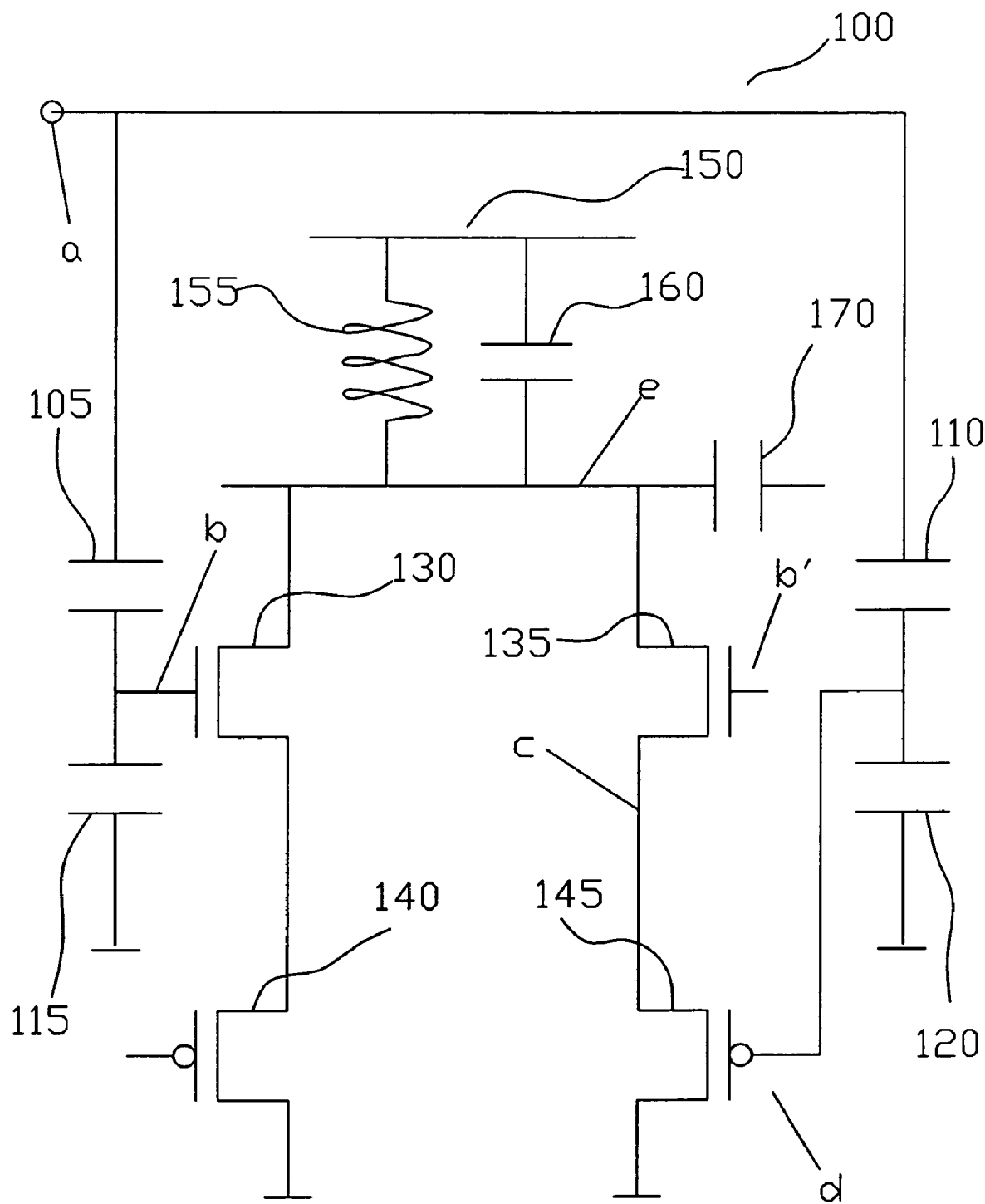
FIG. 1 is a circuit schematic illustrating a CMOS single-ended frequency doubler according to an embodiment of the present invention.

Reference will now be made in detail to the preferred embodiments of the present invention, examples of which are illustrated in the accompanying drawings. Wherever possible, the same reference numbers are used in the drawings and the description to refer to the same or like parts.

Refer to FIG. 1, which is a circuit schematic illustrating a CMOS single-ended frequency doubler according to an embodiment of the present invention.

As shown in FIG. 1, the CMOS single-ended frequency doubler 100 comprises a first capacitor 105 connected between a single-ended input node (a) and the gate of a first transistor 130. A second capacitor 115 is connected between the gate of the first transistor 130 and ground. The source of a first PMOS transistor 140 is connected to the source of the first transistor 130. The drain of the first PMOS transistor 140 is connected to ground.

A third capacitor 110 is connected between the single-ended input node (a) and the gate of a second PMOS transistor 145. The drain of the second PMOS transistor 145 is connected to ground. The source of the second PMOS transistor 145 is connected to the source of a second transistor 135. The drain of the second transistor 135 is connected to the drain of the first transistor 130. A fourth capacitor is connected between the gate of the second PMOS transistor 145 and ground.

A filter 150 comprising an inductor 155 and a filter capacitor 160 is connected to the drains of the first transistor 130 and second transistor 135 for providing further attenuation of higher frequency harmonics.

A coupling capacitor 170 connected to the drains of the first transistor 130 and second transistor 135 couples the oscillator circuit 100 to the next stage through AC coupling.

In operation, only one single-ended input frequency is applied to the input node (a). In order for proper operation of the Balanced Colpitts, the input to the first Colpitts or first transistor 130 needs to have a 180-degree phase shift with the input to the second Colpitts or second transistor 135.

Therefore, a first PMOS transistor 140 and a second PMOS transistor 145 are added. The second PMOS transistor 145 is placed as a follower, which reproduces any voltage shift applied to its gate to its source. The first PMOS transistor 140 is a matching and symmetrical transistor for balance.

The present invention further takes advantage of the possibility to not only drive the second transistor 135 from its gate, but also from its source with a 180 degree phase shift.

As a result, by applying the single-ended signal to the gate of the second PMOS transistor 145, the signal is reproduced to the source of the second transistor 135.

The frequency supplied to the first oscillator or first transistor 130 is a half period out of phase with the frequency supplied to the second oscillator or second transistor 135. The drains of the transistors of each oscillator 130, 135 are connected together and this node (e) will see the sum of the currents through each oscillator 130, 135. As a result, the circuit of the present invention effectively doubles the original single-ended input signal frequency.

The circuit is dimensioned so that the magnitude of the currents through (b) and (b') are equal. Let Ib(t) and Ib'(t) denote these currents respectively. These period currents, which are half a period apart, can be expresses as follows using Fourier decomposition:

$$Ib(t) = \sum_k Ib_k e^{jk(2\pi)/T^* t}$$

$$Ib'(t) = \sum_k Ib'_k e^{jk(2\pi)/T^* [t-T/2]}$$

From the circuit topology as shown in FIG. 1, node (e) sees the sum of these two currents. Since Ib(t) and Ib(t) are equal in magnitude, $Ib=Ib'_k$, for all k.

Hence, let Ic denote the sum of Ib(t) and Ib'(t) that is seen on node (e). This can be written in the following equation:

$$Ic(t) = \sum_k Ib_k e^{jk(2\pi)/T^* t} * [1 + e^{jk\pi}]$$

Because $e^{jk\pi} = -1$ for all odd k values, $Ib_k e^{jk(2\pi)/T^* t} * [1 + e^{jk\pi}] = 0$ if k is odd.

This can be rewritten for only considering the even values of k as:

$$Ic(t) = \sum_{k'} Ib_{k'} e^{jk'(2\pi)/T'^* t} \text{ by writing } k' \text{ as } k' = k/2, \text{ and } T' = T/2.$$

This effectively is a frequency doubling of the original signal. The doubled frequency can be passed on to the next stage through AC coupling via the coupling capacitor 170.

Furthermore, the present invention achieves superior performance for frequency doubling by squaring of the gate voltage in the corresponding drain current. This square of the periodic signal contains a DC component and a double frequency component. As a result, the double frequency component is further enhanced.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. An oscillator circuit that doubles a frequency of a single-ended input signal:
   a first transistor comprising a first gate, a first source, and a first drain;
   a first PMOS transistor comprising a first PMOS gate, a first PMOS source, and a first PMOS drain, the first PMOS drain connected to ground and the first PMOS source connected to the first source;
   a second transistor comprising a second gate, a second source, and a second drain, the second drain connected to the first drain;
   a second PMOS transistor comprising a second PMOS gate, a second PMOS source, and a second PMOS drain, the second PMOS drain connected to ground and the second PMOS source connected to the second source; and
   an input node for inputting the input signal electrically connected to the first gate and the second PMOS gate.

2. The oscillator circuit of claim 1, further comprising:
   a first capacitor connected between the input node and the first gate; and
   a third capacitor connected between the input node and the second PMOS gate.

3. The oscillator circuit of claim 2, further comprising:
   a second capacitor connected between the first gate and ground; and
   a fourth capacitor connected between the second PMOS gate and ground.

4. The oscillator circuit of claim 1, further comprising:
   a filter connected to the first drain and the second drain.

5. The oscillator circuit of claim 4, the filter comprising:
   an inductor; and
   a filter capacitor connected in parallel with the inductor.

6. The oscillator circuit of claim 1, further comprising:
   a coupling capacitor connected to the first drain and the second drain for coupling the oscillator circuit to a next stage.

7. An oscillator circuit that doubles a frequency of a single-ended input signal:

a first transistor comprising a first gate, a first source, and a first drain;

a first PMOS transistor comprising a first PMOS gate, a first PMOS source, and a first PMOS drain, the first PMOS drain connected to ground and the first PMOS source connected to the first source;

a second transistor comprising a second gate, a second source, and a second drain, the second drain connected to the first drain;

a second PMOS transistor comprising a second PMOS gate, a second PMOS source, and a second PMOS drain, the second PMOS drain connected to ground and the second PMOS source connected to the second source;

an input node for inputting the input signal;

a first capacitor connected between the input node and the first gate;

a second capacitor connected between the first gate and ground;

a third capacitor connected between the input node and the second PMOS gate; and a fourth capacitor connected between the second PMOS gate and ground.

8. The oscillator circuit of claim 7, further comprising:

a filter connected to the first drain and the second drain.

9. The oscillator circuit of claim 8, the filter comprising:

an inductor; and a filter capacitor connected in parallel with the inductor.

10. The oscillator circuit of claim 7, further comprising:

a coupling capacitor connected to the first drain and the second drain for coupling the oscillator circuit to a next stage.

11. An oscillator circuit that doubles a frequency of a single-ended input signal:

a first transistor comprising a first gate, a first source, and a first drain;

a first PMOS transistor comprising a first PMOS gate, a first PMOS source, and a first PMOS drain, the first PMOS drain connected to ground and the first PMOS source connected to the first source;

a second transistor comprising a second gate, a second source, and a second drain, the second drain connected to the first drain;

a second PMOS transistor comprising a second PMOS gate, a second PMOS source, and a second PMOS drain, the second PMOS drain connected to ground and the second PMOS source connected to the second source;

an input node for inputting the input signal;

a first capacitor connected between the input node and the first gate;

a second capacitor connected between the first gate and ground;

a third capacitor connected between the input node and the second PMOS gate;

a fourth capacitor connected between the second PMOS gate and ground;

a filter connected to the first drain and the second drain; and a coupling capacitor connected to the first drain and the second drain for coupling the oscillator circuit to a next stage.

12. The oscillator circuit of claim 11, the filter comprising:

an inductor; and a filter capacitor connected in parallel with the inductor.

* * * * *